(12) United States Patent
Fujieda

(10) Patent No.: US 6,781,647 B2
(45) Date of Patent: Aug. 24, 2004

(54) LIQUID CRYSTAL DISPLAY DEVICE HAVING A FRONT LIGHT UNIT

(75) Inventor: Ichiro Fujieda, Tokyo (JP)

(73) Assignee: NEC Corporation, Tokyo (JP)

(*) Notice: Subject to any disclaimer, the term of this patent is extended or adjusted under 35 U.S.C. 154(b) by 172 days.

(21) Appl. No.: 09/842,580

(22) Filed: Apr. 26, 2001

(65) Prior Publication Data

US 2001/0035924 A1 Nov. 1, 2001

(30) Foreign Application Priority Data

Apr. 26, 2000 (JP) ........................................ 2000/125056
Jan. 24, 2001 (JP) ........................................ 2001/16206

(51) Int. Cl.[7] .......................................... G02F 1/1335
(52) U.S. Cl. .......................... 349/61; 349/63; 349/113
(58) Field of Search .......................... 349/65, 113, 114, 349/61, 69, 63, 62; 362/31, 26

(56) References Cited

U.S. PATENT DOCUMENTS

| | | | | |
|---|---|---|---|---|
| 4,142,773 A | * | 3/1979 | Avramenko et al. | ........ 350/3.78 |
| 6,025,894 A | * | 2/2000 | Shirasaki et al. | ............ 349/69 |
| 6,199,995 B1 | * | 3/2001 | Umemoto et al. | ............ 362/31 |
| 6,288,760 B1 | * | 9/2001 | Sawayama | ................... 349/63 |
| 6,340,999 B1 | * | 1/2002 | Masuda et al. | ............... 349/63 |
| 6,462,803 B2 | * | 10/2002 | Kumagai et al. | ........... 349/153 |
| 6,494,585 B1 | * | 12/2002 | Wada | ........................... 362/26 |
| 6,507,378 B1 | * | 1/2003 | Yano et al. | .................... 349/63 |
| 6,556,260 B1 | * | 4/2003 | Itou et al. | ..................... 349/69 |
| 2002/0080597 A1 | * | 6/2002 | Coghlan | ....................... 362/31 |

FOREIGN PATENT DOCUMENTS

| | | |
|---|---|---|
| JP | 10-149881 | 6/1998 |
| JP | 11-305224 | * 11/1999 |
| JP | 11-326903 | 11/1999 |
| JP | 11326903 | 11/1999 |
| JP | 2000-019330 | 1/2000 |
| JP | 2000019330 | 1/2000 |
| JP | 2000-029008 | 1/2000 |
| JP | 2000029008 | 1/2000 |

* cited by examiner

Primary Examiner—Dung T. Nguyen
Assistant Examiner—Mike Qi
(74) Attorney, Agent, or Firm—Katten Muchin; Zavis Rosenman

(57) ABSTRACT

A LCD device includes a LCD unit and a front light unit disposed in front of the LCD unit. The front light unit has a transparent electrode, an organic EL layer and a patterned non-transparent electrode. The non-transparent electrode has a mesh structure for defining light emission areas and transparent areas of the organic EL layer, which are arranged alternately. The light emitted by the light emission areas irradiate the LCD unit. The light reflected by reflective members of the LCD unit passes through the transparent areas of the organic EL layer and reaches to the viewer.

17 Claims, 12 Drawing Sheets

LIQUID CRYSTAL DISPLAY DEVICE HAVING A FRONT LIGHT UNIT

BACKGROUND OF THE INVENTION (a) Field of the Invention

The present invention relates to a liquid crystal display (LCD) device having a front light unit as a light source. The present invention also relates to a structure of a new electroluminescent device.

(b) Description of the Related Art

Reflection type LCD devices are generally used in portable apparatus such as mobile telephones, personal data assistants, mobile computers and the like. The reflection type LCD device includes a front light unit as a light source and is described in Japanese Patent Laid-Open Publication Nos. 2000-29008, 2000-19330 and 11-326903. The conventional reflection type LCD device having a front light unit is described below, with reference to the configuration described in the Publication No. 2000-29008 as an example.

The conventional reflection type LCD device having a front light unit includes a LCD unit 120 and a front light unit 110, which are stacked together so that the front light unit 110 is disposed in front of the LCD unit 120, as shown in FIG. 1. The front light unit 110 includes a cold cathode tube or a linear array of light emitting diodes, and is positioned in the vicinity of the edge of a light guide plate (layer) 112. Moreover, in this particular example, the front surface of the light guide plate 112 far from the LCD unit 120 has an inclined and stepped configuration, and a protective member 113 is disposed on top of the inclined and stepped surface.

The operation of the conventional LCD device is as follows. The light emitted from the light source 111 penetrates through a side surface 112a of the light guide plate 112, and following a variation in the course thereof at the reflective surface 112b, is transmitted through a light exit surface 112c and irradiated onto the LCD unit 120. The light irradiated onto the LCD unit 120 passes sequentially through a polarizing plate 126, a phase plate 125, a transparent substrate 124 and a liquid crystal layer 123, and is then reflected by a plurality of reflective members 122. The reflected light passes through the same members in a reverse direction, and is transmitted from the LCD unit 120 to the font light unit 110.

The amount of light transmitted from the upper surface of the reflective members 122 of the LCD unit 120 is controlled by the alignment direction of the liquid crystal molecules of the LC layer 123. Consequently, by controlling the voltage applied to the liquid crystal layer 123 separately for each of the reflective members 122, any desired pattern can be displayed by the LCD device.

The light from the LCD unit 120 is transmitted through the front light unit 110 toward the front side of the LCD device and reaches a viewer (not shown in the figure). In the configuration shown in FIG. 1, damage to the reflective surface 112b is prevented by the protective member 113.

Referring to FIGS. 20A and 20B, there is shown a cellular phone including the conventional reflection type LCD device having a front light unit. The cellular phone includes a first housing member 150 and second housing member 160, which are coupled to form a housing. The housing receives therein a LCD device 131, surface-mounted electronic parts 132, switch 136, speaker etc., which are mounted on a printed circuit board 130. Other parts 134 such as a vibrator and connectors are mounted on a flexible printed circuit board 133 and connected to the parts on the printed circuit board 130. A protective cover 161 is attached on the second housing member 160, for protecting the LCD device 131 against mechanical impact, moisture and stain. The protective cover 161 is made of a plastic material such as polycarbonate having a thickness of 1 mm. It is desired that the LCD device 131, especially if used in the cellular phone, have a smaller thickness.

The conventional reflection type LCD devices which utilize front light units are constructed so that light emitted from a light source positioned in the vicinity of the edge of a light guide plate is transmitted through the light guide plate, changes the course at the surface of the light guide plate, and then irradiates the reflection type LCD unit. Design of the mechanism for extracting the light from the light guide plate (such as a surface with a stepped or prism shaped configuration) is important, although it is difficult to ensure a uniform brightness across the entire display area of the LCD device.

Furthermore, this type of mechanism for extracting light may also reflect and change the course of external light during a display operation in an ambient light condition wherein the front light unit is not used as a light source, and thus may cause a deterioration in the display performance. Moreover, if foreign matter such as dust or oil adheres to the surface of the light guide plate of the front light unit, then such soiled areas produce excessive scattering of the light, making a uniform brightness even more difficult. Furthermore, the light emitted from the light source also leaks out from the external side surface of the light guide plate outside the LCD device, thereby degrading the optical efficiency, or the efficiency of the light power.

Moreover, LCD devices are known which have a function for displaying information using only a portion of the display area (hereafter referred to as a "partial display function"), such as for time of day and communication status information on the display device of a mobile telephone. With the front light unit of the conventional LCD device, it is not possible to selectively irradiate a specified area of the display device.

SUMMARY OF THE INVENTION

An object of the present invention is to provide a low cost reflection type LCD device equipped with a front light unit, which is capable of efficiently and uniformly illuminating a LCD unit and does not significantly degrade the display performance even with foreign matter adhered thereto.

Another object of the present invention is to provide a low cost reflection type LCD device having a partial display function.

A further object of the present invention is to provide a method for manufacturing a LCD device including a front light unit and having a simple structure.

A further r object of the present invention is to provide a small-size light unit implemented by an organic EL device.

In a first aspect of the present invention, a liquid crystal display (LCD) device includes a LCD unit and a front light unit disposed at a front side of the LCD unit, the LCD unit having a plurality of light reflective members arranged in a matrix, the front light unit including a light emission area for emitting light toward the LC unit and a transparent area for passing light reflected from light reflective members of the LCD unit toward a front side of the front light unit.

In a second aspect of the present invention, a liquid crystal display (LCD) device includes a LCD unit and a front light unit disposed at a front side of the LCD unit, the LCD unit having a plurality of light reflective members arranged in a matrix, the front light unit including a transparent electrode, an electroluminescent layer and a non-transparent electrode consecutively arranged as viewed toward a front side of the front light unit.

In a third aspect of the present invention, an electroluminescence device includes a substrate and a multi-layered structure including a transparent electrode, an electroluminescent layer and a non-transparent electrode, which are consecutively formed on the substrate, wherein the non-transparent electrode has a patterned structure.

In a fourth aspect of the present invention, a method for manufacturing a liquid crystal display (LCD) device including the steps of forming a LCD unit having a plurality of reflective members arrayed in a matrix, forming a transparent electrode in front of the LCD unit, forming an electroluminescent (EL) layer on the transparent electrode, and forming a non-transparent electrode on the EL layer and having a specified pattern.

In a fifth aspect of the present invention, a method for manufacturing a liquid crystal display (LCD) device including the steps of forming a non-transparent electrode having a specific pattern on a transparent protective member, forming an electroluminescent (EL) layer on the non-transparent electrode, forming a transparent electrode on the EL layer, and forming a LCD unit at a rear side of the transparent electrode.

In accordance with the LCD devices of the present invention, and LCD devices manufactured by the methods of the present invention, the specified structures of the front light unit effectively function as front light units for the LCD units.

In accordance with the EL device of the present invention, the new structure of the EL device can be used for a variety of purposes such as a lighting unit.

The above and other objects, features and advantages of the present invention will be more apparent from the following description, referring to the accompanying drawings.

DETAILED DESCRIPTION OF THE PREFERRED EMBODIMENT

Figure 1:
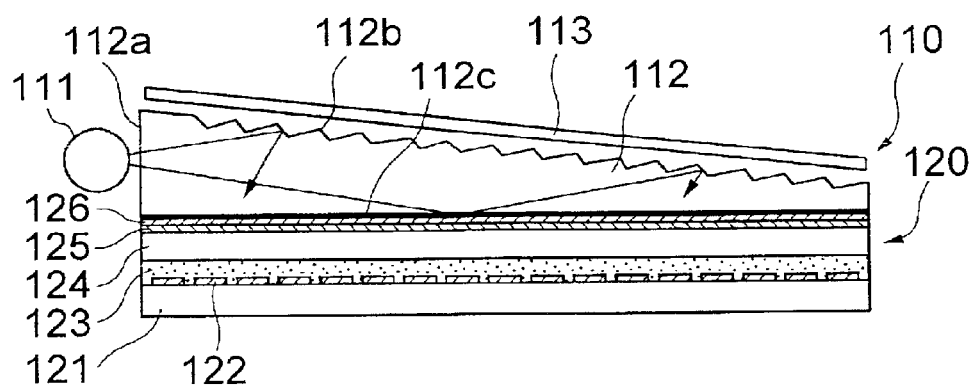
FIG. 1 is a schematic sectional view showing a conventional LCD device having a front light unit.

Embodiments of the present invention will be described in detail, with reference to the accompanying drawings, wherein similar constituent elements are designated by similar or related reference numerals throughout the drawings.

Figure 2A:
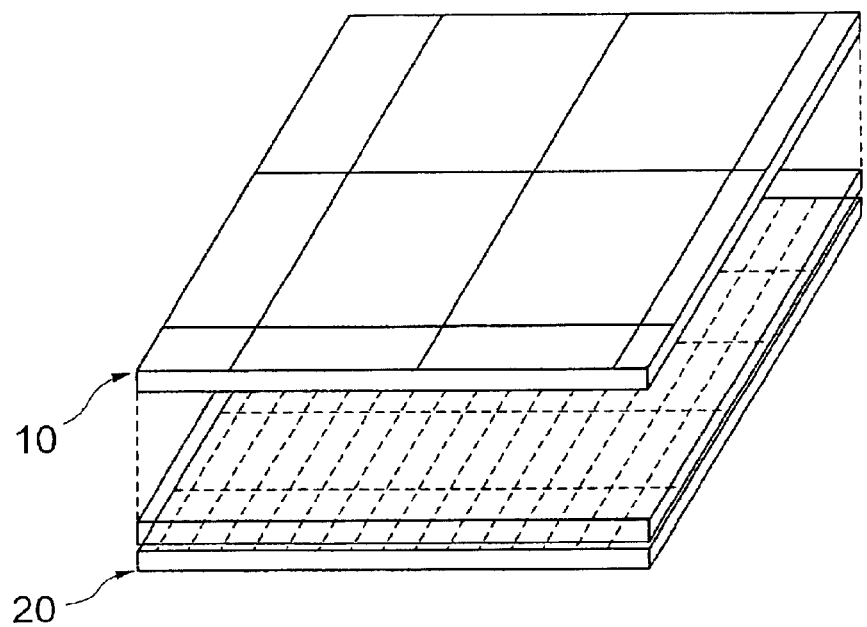
FIGS. 2A is a developed perspective view of a LCD device having a front light unit according to a first embodiment of the present invention.
Figure 2B:
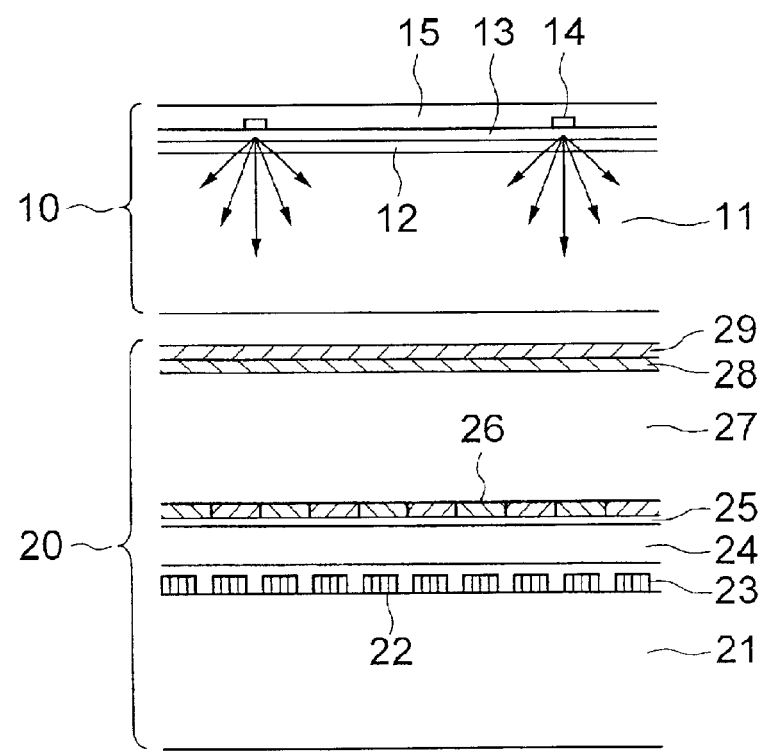
FIG. 2B is a schematic sectional view of the LCD device of FIG. 2A.

FIG. 2A shows the principal constituent elements of the LCD device according to a first embodiment of the present invention, and FIG. 2B shows the configuration of those elements. In the LCD device of the present embodiment, as shown in FIG. 2A, a front light unit 10 is stacked onto a LCD unit 20 at the front surface thereof. As can be seen in the sectional view of FIG. 2B, the front light unit 10 includes a transparent electrode 12, an electroluminescence (EL) layer 13 formed of an organic material, and a non-transparent electrode 14, which are layered consecutively onto a transparent substrate 11. A protective layer 15 is provided on the front surface of the front light unit 10.

The LCD unit 20 includes: a transparent substrate 21 mounting thereon a plurality of reflective members 22 arranged in a matrix and an alignment film 23; a transparent substrate 27 mounting thereon a plurality of color filters 26 and an alignment film 25; and a liquid crystal layer 24 disposed between the transparent substrate 21 and the transparent substrate 27.

Figure 3:
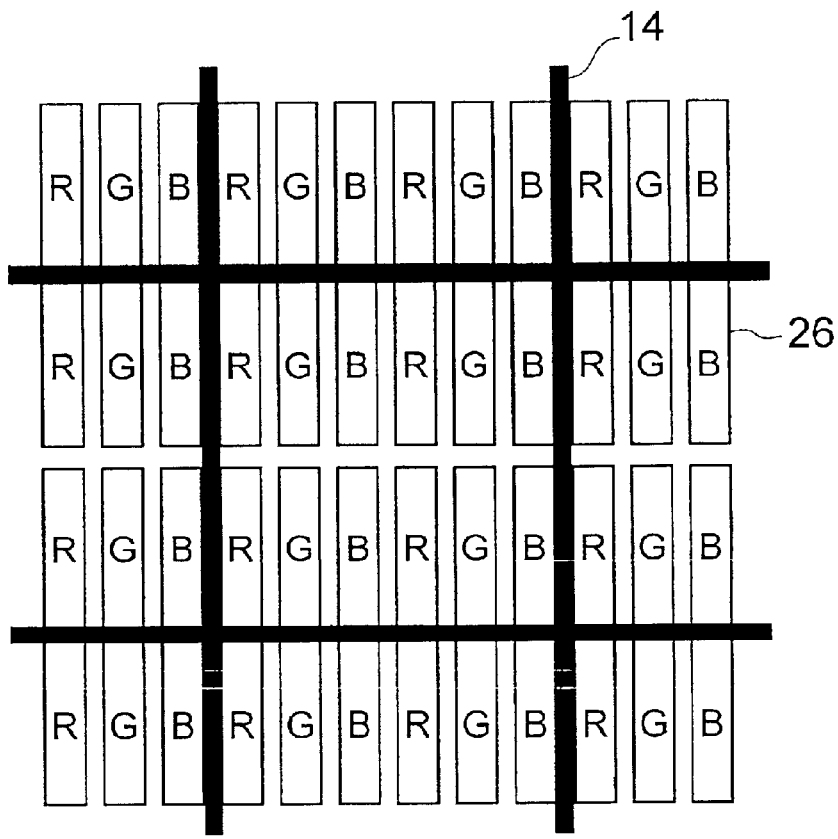
FIG. 3 is an explanatory diagram showing the positional relationship between a non-transparent electrode of a front light unit and a color filter of the LCD device of FIG. 2A.
Figure 4:
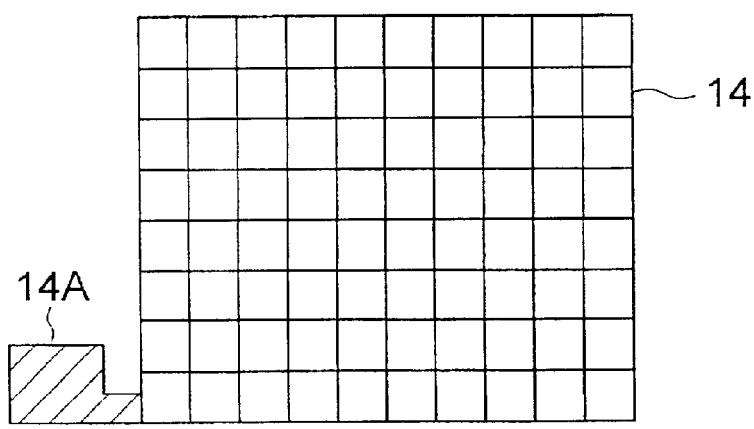
FIG. 4 is an explanatory diagram showing the shape of the non-transparent electrode of the front light unit of the LCD device of FIG. 2A.

FIG. 3 depicts the positional relationship between the non-transparent electrode 14 of the front light unit 10, and the color filters 26 of the LCD unit 20, which are viewed from the front of the LCD device. The non-transparent electrode 14 of the front light unit 10 is formed in a mesh structure as shown in FIG. 4, and includes an external terminal 14A for applying a driving voltage. In the example shown in FIG. 3, a single square of the mesh of the non-transparent electrode 14 of the front light unit 10 is formed so as to correspond to four pixels of the LCD unit 20 each including R, G, B color filters or reflection members. The proportion of the area occupied by the non-transparent electrode 14 is extremely small relative to the front surface of the front light unit 10. The area of the non-transparent electrode 14 as viewed from the front of the LCD device corresponds to a luminescence area or light emission area of the organic EL layer 13, and the other area of the organic EL layer 13 not covered by the non-transparent electrode 14 constitutes a light transmission area. The luminescence area and the light transmission area are disposed alternately in the organic EL layer 13 in X- and Y-directions.

Figure 5:
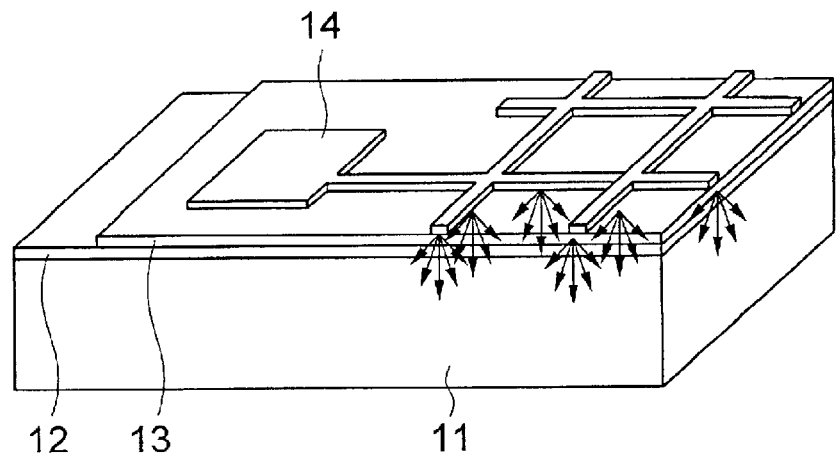
FIG. 5 is a perspective view showing a schematic configuration of a portion of the front light unit of the LCD device of FIG. 2A, as well as the operation of the front light unit.

FIG. 5 shows the configuration of the front light unit 10 in the vicinity of the external terminals for applying a source voltage to the electrodes including the non-transparent electrode 14 and the transparent electrode 12 of the front light unit 10. The transparent electrode 12 is entirely formed across the surface of the transparent substrate 11, and with the exception of a terminal section thereof, is covered completely by the organic EL layer 13 which also functions as an insulating layer.

The mesh shaped non-transparent electrode 14 formed on top of the organic EL layer 13 does not contact the transparent electrode 12. The front light unit 10 and the LCD unit 20 may be arranged with an air gap disposed therebetween, or may be fixed together using a transparent adhesive having a refractive index approximately equal to that of the transparent substrate.

As follows is a more detailed description of the present embodiment, including specific examples of materials, manufacturing processes and numerical values. The transparent substrate 11 of the front light unit 10 is a glass plate, plastic substrate, film substrate or the like, having a thickness of approximately 0.3 to 1 mm. The transparent electrode 12 is formed by sputtering indium tin oxide (ITO), for example, across the entire surface of the transparent substrate 11. If ITO is used as a material for the transparent electrode 11, the sheet resistance is approximately 20Ω/□ and the thickness is approximately 100 nm. Known examples of the structure for the organic EL layer 13 include a two-layered structure including a luminescence layer and a hole injection/transport layer, a three-layered structure including an additional electron injection/transport layer to the two-layered structure, and another structure incorporating therein an additional thin insulating film formed at the interface with the metallic electrode in the two- or three-layered structure. Any of these structures can be applied to the configuration shown in FIG. 2B.

In other words, although FIG. 2B schematically depicts the organic EL layer 13 as a single layer, a variety of constructions, such as those described above, are possible. Known methods of manufacturing the organic EL layer 13 include spin-coating, vacuum evaporation and ink jet printing. Depending on the manufacturing method used, the manufacturing conditions employed are determined, such as selection of the organic EL material, including whether a high molecular weight or low molecular weight organic EL material is used, the structure of the underlying substrate or base, and the method used for manufacturing the upper electrode.

The organic EL layer 13 of the present embodiment is formed as follows. Examples of the material for a hole injection/transport layer include a triarylamine derivative, an oxadiazole derivative, and a porphyrin derivative. Examples of the material for a luminescent material include a metal complex of either 8-hydroxyquinoline or a derivative thereof, a tetraphenylbutadiene derivative, and a distyrylaryl derivative. These layers may be formed by using a vacuum evaporation technique to form a multi-layered structure each layer of which is approximately 50 nm thick. During this process, a metallic shadow mask is used so that the organic EL material is not deposited on the terminal section of the transparent electrode 12 shown in FIG. 4. The wavelength of light can be selected by appropriate selection of the organic EL material. In this embodiment, the material for the organic EL layer 13 is selected so that the light has three components with peaks at approximately 450 nm, 540 nm and 630 nm corresponding to the three primary colors.

The non-transparent electrode 14 is formed, for example, by vacuum evaporation of a material such as an alloy of aluminum and lithium through a metallic shadow mask, to yield a layer approximately 200 nm thick. Finally, in order to protect the organic EL layer 13 against oxygen and moisture, a protective layer 15 made of a metallic oxide, or a metallic sulfide or the like is provided over the entire surface. Alternatively, instead of forming the protective layer 15, a package structure may also be formed by covering all the elements with a plastic cover, and then replacing the air inside the plastic cover with an inert gas such as nitrogen or argon.

By applying a source voltage to the light emission area of the organic EL layer 13 sandwiched between the transparent electrode 12 and the stripe sections of the non-transparent electrode 14, with the transparent electrode 12 functioning as the anode and the non-transparent electrode 14 as the cathode, the organic EL layer 13 functions as a white light emitting diode with three light emission peaks.

The LCD unit 20 may be any one of a variety of reflection type LCD devices, which differ in terms of the system used for writing image signals to the pixels. Suitable LCD units include simple matrix type units in which the orientation of the liquid crystal molecules of the LC layer is controlled by stripe electrodes orthogonal with each other, MIM (metal-Insulator-Metal) type units in which a voltage is applied to separate pixel electrodes by using a diode element having an insulator sandwiched between two layers of a metal, and TFT type units in which instead of the aforementioned diode, a thin film transistor (TFT) with a base material such as amorphous silicon or polycrystalline silicon is used for applying a voltage to separate pixel electrodes. In any of these types, the area of the liquid crystal layer for which the voltage can be separately controlled includes a plurality of pixel electrodes, and these pixel electrodes are arrayed in a suitable order.

The LCD unit 20 shown in FIGS. 2A and 2B is an example of the reflection type color LCD unit. The color LCD unit 20 includes the electrode substrate 21 having a plurality of reflective members arrayed regularly on top of a glass substrate or the like, and the transparent substrate 27 having a uniform transparent electrode 27 and a separate color filters 26, with the liquid crystal layer 24 having a thickness of 2 to 5 μm being disposed therebetween. The transparent substrate 27 and the electrode substrate 21 are positioned so that the color filters 26 and the reflective members 22 are aligned in a one-to-one correspondence. Furthermore, the alignment films 23 and 25 are formed on those surfaces of the two substrates 27 and 21 in contact with the liquid crystal, and cause the liquid crystal molecules to be oriented at a specific angle.

Moreover, a phase plate 28 and a polarizing plate 29 are layered onto the surface of the transparent substrate 27 far from the liquid crystal 24. The reflective members 22 have a corrugated shape so as to reflect the light across a wide range of directions. A plurality of drive voltages can be applied to separate reflective members 22. These reflective members 22 can be formed by, for example, using photolithography to form a corrugated shape on a material such as polyimide, using a sputtering technique to form a layer of a highly reflective material such as aluminum thereon, and then using photolithography to form separate patterns. Each pixel, which is the unit element for display in the LCD device, includes three color filters R, G, B in a single unit element.

If the pitch of the arrangement of these pixels in the array is small, then a high definition image display is possible. For example, it is assumed that each of R, G, B pixels shown in FIG. 3 occupies an area of approximately 120 $\mu$m×30 $\mu$m, and is arrayed at a pitch of 127 $\mu$m. In addition, the thickness of the transparent substrate 27 is between 0.3 mm and 1 mm. In such a case, as will be understood from FIG. 3, the non-transparent electrode 14 of the front light unit 10 is formed as a mesh having a pitch equivalent to two pixels of the LCD unit 20, namely 254 $\mu$m. If the pattern width of the stripes of the mesh is set at 10 $\mu$m, then the proportion of the surface area occupied by the non-transparent electrode is (10/254)×(10/254)=0.00155, equivalent to a 99.8% transparency.

Next is a description of the operation of the LCD device of the first embodiment with reference to FIG. 2A to FIG. 5. If a voltage of approximately 5 V to 15 V is applied between the transparent electrode 12 and the non-transparent electrode 14 in the front light unit 10, then a white light is emitted from the light emission area of the organic EL layer 13 sandwiched between the mesh of the non-transparent electrode 14 and the transparent electrode 13. If no particular modifications or alterations are made to the construction of the organic EL layer, then the light is emitted equally in all directions. As will be understood from FIGS. 2A, 2B and 5, the LCD unit 20 is irradiated by the light emitted in the direction toward the LCD unit 20 as it is emitted, as well as by the light emitted toward the non-transparent electrode 14 after the reflection thereof at the rear surface of the non-transparent electrode 14.

The light passes sequentially through the transparent electrode 27 and the color filters 26 of the LCD unit 20, with only the light components each having the wavelength selected by a corresponding one of the color filters 26, reaching the reflective members 22. The positional relationship between the non-transparent electrode 14 (namely, the light emission area) and the reflective members 22 determines whether or not the surfaces of the reflective members 22 are irradiated uniformly. A larger pitch of the light emission area, i.e., larger pitch of the mesh, affords a less uniform distribution of brightness across the surface including the reflective members 22. In contrast, a smaller pitch of the mesh affords a larger area of the non-transparent electrode relative to the entire surface area.

It is to be noted that, if the front light unit 10 is not energized, then the amount of light reaching the reflective members 22 decreases, resulting in a dimming of the screen or image. In this manner, it is necessary to consider both the efficiency of usage of the surrounding light and the brightness distribution resulting from the front light unit 10 before determining the positional relationship between the non-transparent electrode 14 and the reflective members 22. This type of consideration produces the positional relationship between the mesh-shaped non-transparent electrode (namely, the light emission area) 14 and the reflective members 22 (and color filters 26) such as shown in FIG. 3, where four pixels are formed corresponding to each square of the mesh.

Furthermore, since the distance from the light emission area of the front light unit 10 to the reflective members 22 of the LCD unit 20 is as large as 0.6 mm, and the directivity of the light is not narrow, as described before, the reflective members 22 are irradiated uniformly. The targeted amount of the surrounding light used, and the amount of the light emitted from the front light unit are dependent on the design, e.g., the environment in which the LCD device is to be used. The numerical values described above are mere examples, and do not limit the structure of the LCD device of the present invention.

The light reaching the reflective members 22 is reflected and passes back through the liquid crystal layer 24 and the color filters 26 in sequence. The light, after passing through the area not occupied by the non-transparent electrode 14 of the front light unit 10, ultimately reaches a viewer (not shown in the figures). The amount of light transmitted can be controlled by changing the voltage applied to the liquid crystal layer 24, thereby enabling the display of any desired image.

As described above, in the LCD device of the present embodiment, because the front light unit 10 is of an area-emission type and has a light emission area and a transparent area disposed alternately in a suitable configuration, an excellent display performance can be obtained both when the front light unit is used as a light source, and when the light source in the front light unit is not used. In particular, when the front light unit is used to emit light, the light can be irradiated uniformly over the entire display area of the LCD device.

Furthermore, since no special mechanism is used for changing the course of external light entering from the surroundings, the problems associated with conventional LCD devices having front light units are not involved in the present embodiment. Namely, the scattering of surrounding external light and the deterioration in display performance, when foreign matter such as dust or oil adheres to the display surface, can be resolved. Moreover, since almost all the light emitted from the front light unit is used for the brightness of the LCD device, and almost all of the reflected light reaches the viewer, the present embodiment offers the advantage of a high optical efficiency when the front light unit is used.

In the above description, the non-transparent electrode 14 is made of a single material; however, it is also possible to form a non-transparent electrode 14 in which the surface not in contact with the organic EL layer 13 has a light absorption property, by for example, anodizing the surface of an aluminum sheet and plating a black colored pigment thereon. In such a case, the light which enters the front light unit from the surroundings and does not permeate through the front light unit is absorbed by the non-transparent electrode. Consequently, reduction in the contrast ratio of the LCD device resulting from the reflection by the non-transparent electrode is prevented, and a high level of contrast ratio can be achieved.

In the above embodiment, a front light unit is described in which only the non-transparent electrode is patterned and formed into a mesh shape, with the exception of the terminal section thereof. However, the present invention does not limit the structural elements to the particular shape. In other words, similar effects can be achieved if, for example, other structural elements of the front light unit such as the organic EL layer and the transparent electrode are patterned in a similar manner.

Figure 6:
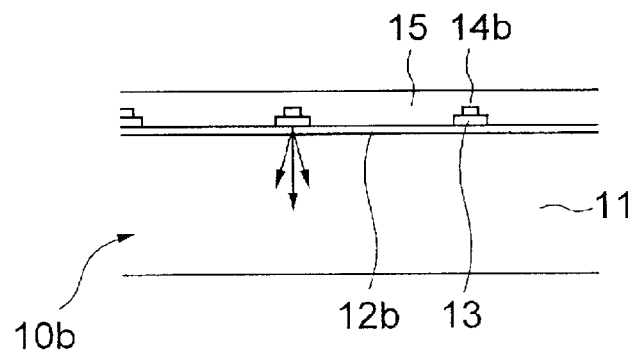
FIG. 6 is a schematic cross-sectional view showing a modification of the front light unit of the LCD device of FIG. 2A.
Figure 7:
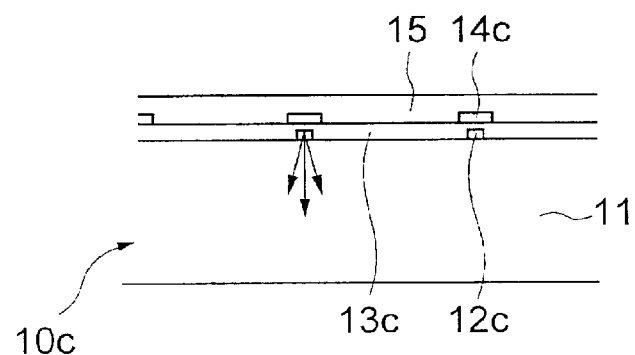
FIG. 7 is a schematic cross-sectional view showing another modification of the front light unit of the LCD device FIG. 2A.
Figure 8:
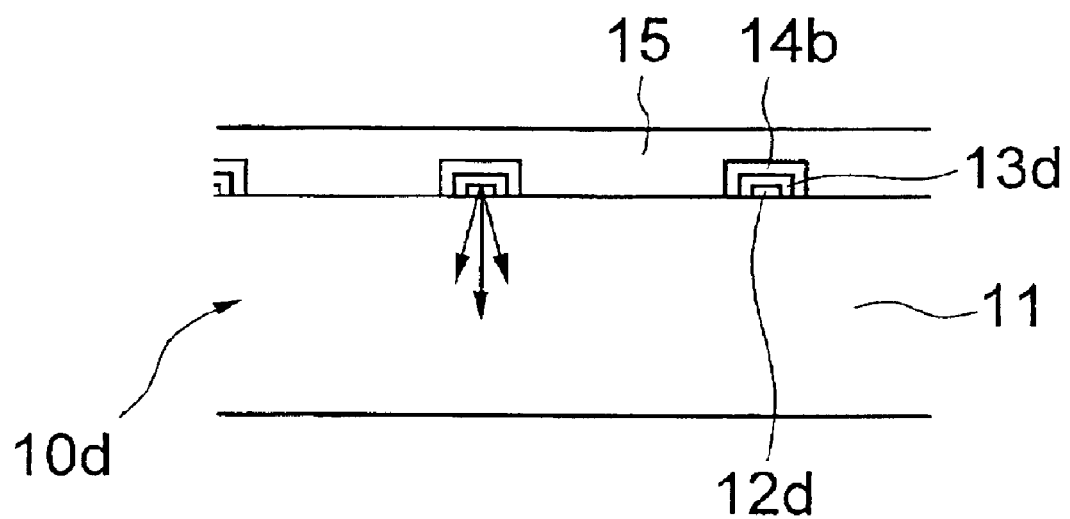
FIG. 8 is a schematic cross-sectional view showing still another modification of the front light unit of the LCD device of FIG. 2A.

FIG. 6 to FIG. 8 are schematic sectional views showing modifications of the front light unit of the first embodiment.

In a front light unit 10b shown in FIG. 6, an organic EL layer 13b is patterned similarly to a non-transparent electrode 14b, and is positioned beneath the non-transparent electrode 14b. In a front light unit 10c shown in FIG. 7, a transparent electrode 12c is patterned and is positioned beneath a non-transparent electrode 14c with an intervention of an organic EL layer 13c. In a front light unit 10d shown in FIG. 8, both a transparent electrode 12d and an organic EL layer 13d are patterned, and are positioned beneath a non-transparent electrode 14d. The operation and effects of these front light units are similar to those described for the embodiment of FIG. 2A.

It is to be noted, however, that the modification shown in FIG. 8 is different from the other modifications and the embodiment in that the organic EL layer 13d is covered by the non-transparent electrode 14d on the side surfaces thereof, and thus light escaping through the side surfaces is blocked by the non-transparent electrode 14d. In the modifications shown in FIG. 6 to FIG. 8, additional process steps are conducted for patterning the electrode materials for the front light unit by using photolithography. These additional process steps are associated with an undesirable increase in the manufacturing costs, although the modifications of FIG. 7 and FIG. 8 offer the advantage of improving the optical efficiency of the front light unit, by removing the overlapping with the transparent electrode at the terminal section.

In contrast, in the configuration shown in FIG. 5, since the organic EL layer 13 and the transparent electrode 12 also exist beneath the terminal section formed by patterning of the non-transparent electrode 14, light emission also occurs from this terminal section. However, the terminals are formed in an area of the LCD unit 20 where no reflective members 22 exist, and thus the light emitted from the terminal section cannot be utilized for display purposes. Nevertheless, this light could be used for display other than the LCD, unit or for external illumination.

Figure 9A:
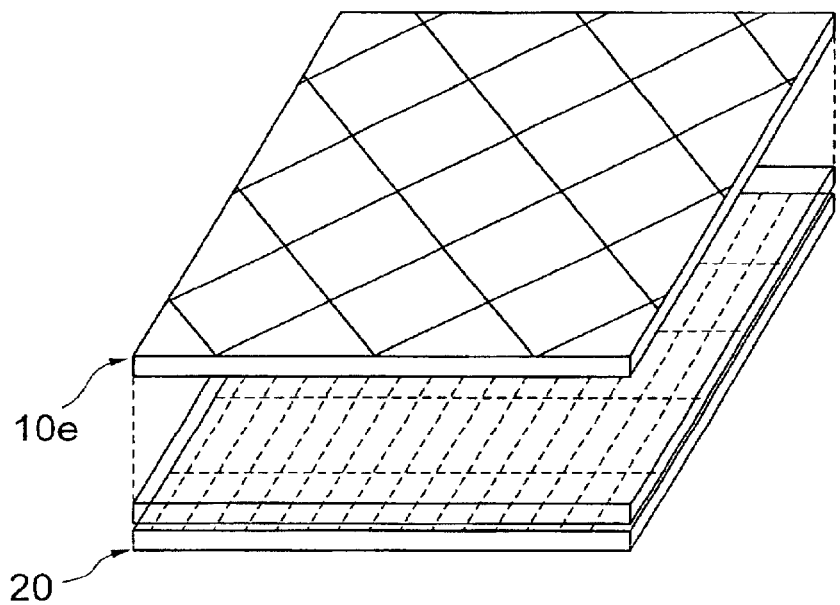
FIG. 9 is an explanatory diagram showing a modification of the aforementioned LCD device.
Figure 9B:
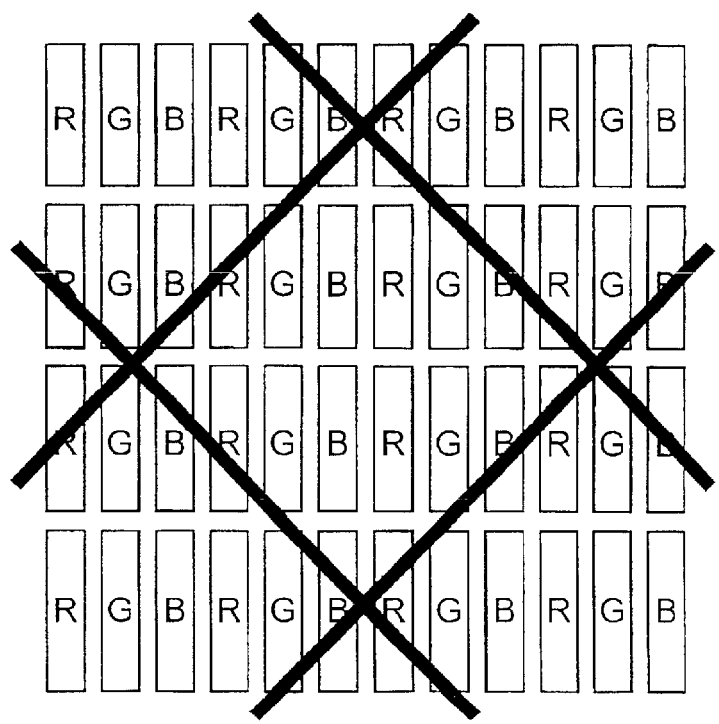

In the above embodiments, examples are described in which the mesh-shaped light emitting area of the front light unit 10 is positioned in alignment with the space or gap between the reflective members 22 of the LCD unit 20. An example of a conceivable modification of the first embodiment is shown in FIGS. 9A and 9B, where a mesh shaped non-transparent electrode of a front light unit 10e is positioned at a 45-degree rotation relative to the directions of the arrangement of the reflective members in the LCD unit 20. In the first embodiment, if a stripe of the non-transparent electrode 14 overlaps with the columns of the reflecting members 22 displaying a particular color, the brightness of the particular color is affected by the overlapping, thereby resulting in a decrease in the particular color. The purpose of the rotation of the mesh of the non-transparent electrode 14 shown in FIGS. 9A and 9B is to prevent such a situation. Both angles need not be limited to 45 degrees. However, depending on the selection of factors such as these angles and the pitch of the non-transparent electrode 14, a moire pattern may occur, causing a deterioration in the display performance of the LCD device, and so care must be taken in consideration thereof.

Generally, when a pattern of one period is superposed on a pattern with a different period, an undesirable regular pattern (moire pattern) occurs, and its period is determined by the two periods. When a front light unit of the conventional structure is stacked onto a LCD unit, this type of moire pattern can develop as a result of the regular pattern provided on the light guide plate and the regular pattern of the structural elements of the LCD unit. In the aforementioned Japanese patent laid-open publications relating to conventional technology, conditions relating to the structural elements are determined experimentally so that moire patterns are suppressed to an allowable level to the viewer.

Specifically, the results in a requirement whereby the angle between the one-dimensional pattern provided on the light guide plate and the pixel array of the LCD unit should be between 22.5 and 25 degrees. This numerical range is characteristic only at specific experimental conditions, and is in no way widely applicable. For example, the angle varies depending on experimental factors such as the viewing angle and the brightness of the surroundings.

In contrast, it is already known that one method of preventing the formation of a moire pattern is to ensure that the spatial frequency of one pattern is an integral multiple of the spatial frequency of the other pattern. The configuration shown in FIG. 3 satisfies this requirement in that the period of one pattern is set at twice the period of the other pattern, and consequently, substantially no moire pattern occurs.

If the mesh pattern is inclined at an angle of 45 degrees, as described above, then the spatial frequency spectrum of the mesh pattern projected in the direction of the regular pattern of the LCD device has no sharp peaks, and as a result, any moire pattern is practically unnoticeable.

Figure 10:
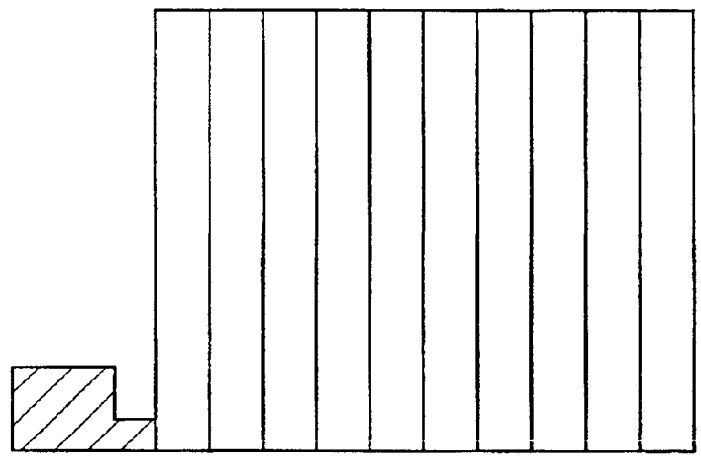
FIG. 10 is an explanatory diagram showing a modification of the non-transparent electrode of the front light unit of the LCD device of FIG. 2A.
Figure 11:
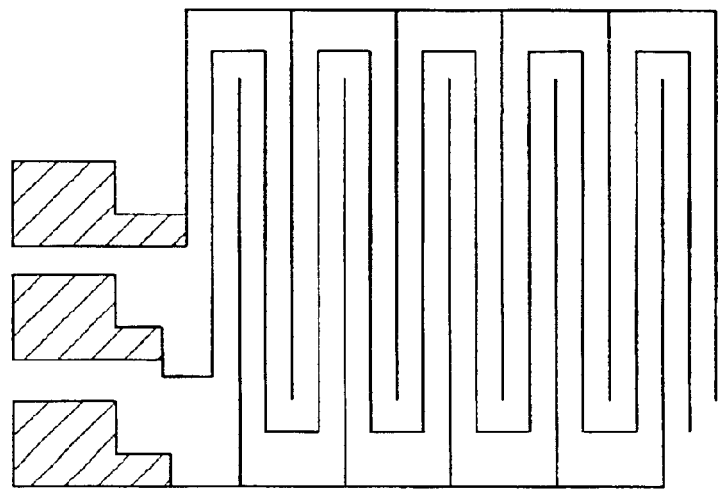
FIG. 11 is an explanatory diagram showing the configuration of a non-transparent electrode of a front light unit, in a LCD device with a front light unit according to a second embodiment of the present invention.

In addition, the description is made on a front light unit having non-transparent electrodes which are mesh shaped. However, the shape of the non-transparent electrode is not limited to this type, or a mesh shape. For example, similar effects can be achieved using the linear patterns extending parallel to one another, as shown in FIG. 10, or interlocking patterns with zigzag lines, such as shown in FIG. 11.

Furthermore, in the above description, a reflection type LCD unit having color filters is described as an example. The present invention can also be applied to monochrome reflection type LCD devices without a color filter. Moreover, the front light unit described in the example has a construction in which light is irradiated towards a transparent substrate; however, an alternative construction is also possible in which the transparent electrode and the non-transparent electrode are interchanged and the light is irradiated away from the transparent substrate. In this manner, it will be understood that various modifications of the constituent elements are possible without departing from the present invention, and thus such modifications are viewed as variants of the first embodiment.

In a second embodiment of the present invention, the non-transparent electrode of the front light unit has a divided configuration. More specifically, FIG. 11 is an explanatory diagram showing the configuration of such an electrode of the front light unit. In FIG. 11, the non-transparent electrode of the front light unit is divided into three sections. The second embodiment is different from the first embodiment in the configuration wherein a specified voltage is applied independently to any number of these three sections. By enabling the specified voltage to be applied independently to three parallel electrodes, the electrode configuration of FIG. 11 enables the brightness of the front light unit to be set in three steps.

This offers the advantage that the brightness of the front light unit can be controlled by a simple drive circuit. Even in the configuration of the first embodiment, the brightness of the front light unit can be controlled by adjusting the voltage applied to the organic EL layer. However, this requires an accurate understanding of the characteristics of the voltage applied to, and the light output from, the organic EL layer, and also requires a precise control for the voltage to be applied. In the configuration of FIG. 11, three digital signals enable eight different brightness levels to be achieved, corresponding to the eight possible combinations of application of a single voltage, for example 5 V, wherein the single voltage is applied to any number of the three electrodes having different configurations. By using this type of digitized drive, an advanced amplifier circuit is unnecessary. It is to be noted that increase of the number of electrodes enables a more precise brightness control to be achieved.

In the examples described above, the non-transparent electrode of the front light unit is divided into a plurality of sections. Similar effects can be achieved by dividing the transparent electrode into a plurality of sections. Consequently, such modified configurations are viewed as variants of the second embodiment of the present invention.

Figure 12:
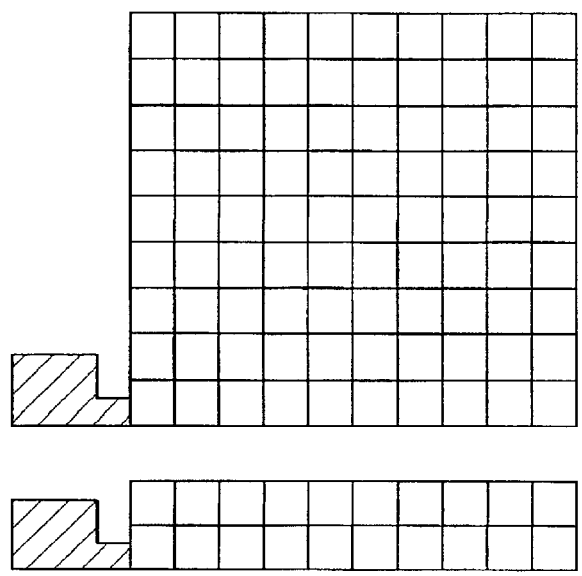
FIG. 12 is an explanatory diagram showing the configuration of a non-transparent electrode of a front light unit, in a LCD device of FIG. 11.

In the second embodiment, all of the plurality of divided electrodes in the front light unit cover substantially the entire display area of the LCD device. In an alternative, a configuration such as shown in FIG. 12 may be used, wherein the non-transparent electrode of the front light unit is divided into two sections which cover separate display areas of the LCD device. Such a configuration offers the advantage of enabling illumination of only a specific minor area of the LCD device. A partial display function of mobile telephones is an example of this type of display technique.

In the example described above, the non-transparent electrode of the front light unit is divided into a plurality of sections. Similar effects can be achieved by dividing the transparent electrode into a plurality of sections. Consequently, such modified configurations are viewed as variants of the second embodiment of the present invention.

Figure 13:
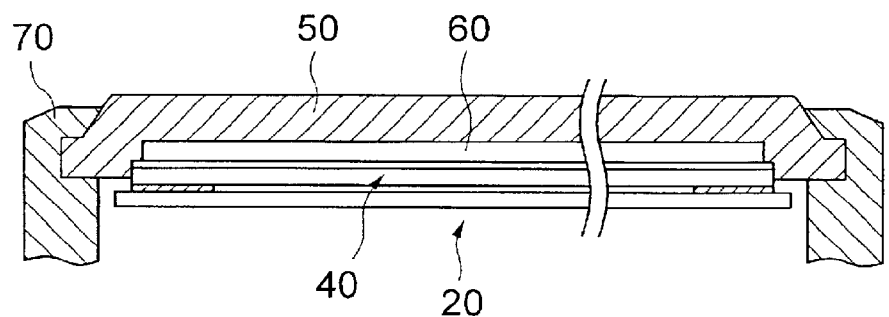
FIG. 13 is a sectional view of a LCD device according to a third embodiment of the present invention.

Referring to FIG. 13, a LCD device according to a third embodiment of the present invention includes a front light unit having a smaller thickness. Specifically, the front light unit 40 is formed on the display panel of the LCD unit 20, and a protective member or cover 50 is disposed in front of the front light unit 40. The protective cover 50 is fixed onto the front light unit 40 by an adhesive at the outer periphery of the front light unit 40, i.e., outside the display area of the LCD device. The space 60 between the front light unit 20 and the protective cover 50 is filled with an inert gas, such as nitrogen. The LCD device including the LCD unit 20, front light unit 40 and the protective cover 50 is fixed to a housing 70 of a cellular phone, for example.

Figure 14:
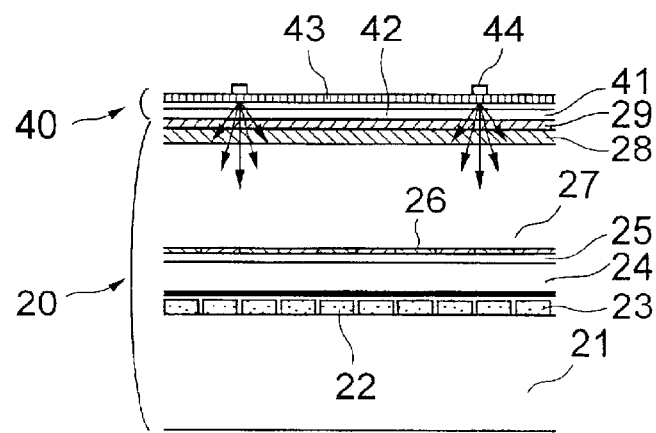
FIG. 14 is a detailed sectional view of the LCD device of FIG. 13.

Referring to FIG. 14, there is shown a detailed configuration of a portion of the LCD device of FIG. 13. The front light unit 40 has a multi-layered structure including a transparent electrode 42, an organic EL layer 43, a non-transparent electrode 44, the non-transparent electrode 44 having a smaller area compared to the transparent electrode 42 and the organic EL layer 43.

The LCD unit 20 includes an electrode substrate 21 made of glass and mounting thereon a plurality of reflective members 22 arrayed in a matrix, a transparent substrate 27 mounting thereon a transparent electrode having a uniform thickness and: a plurality of color filters 26, and a LC layer 24 sandwiched between the electrode substrate 21 and the transparent substrate 27. The LC layer 24 has a thickness of 2 to 5 µm. The transparent substrate 27 and the electrode substrate 21 are aligned so that the color filters 26 and the reflective members 22 oppose in one-to-one correspondence. Alignment films 23 and 25 are formed on the surfaces of both the substrates 21 and 27, respectively, for alignment of LC molecules in the LC layer 24 with a specified orientation.

Examples of the LCD unit 20 used in the LCD device of the present invention include a variety of types of LCD unit, such as a simple matrix type wherein the orientation of the LC molecules is controlled by a pair of groups of stripe electrodes, each group extending normal to the other group, a metal-insulator-metal (MIM) type wherein a plurality of diodes each having a MIM structure apply voltages to respective pixel electrodes, a TFT type wherein a plurality of thin film transistors having a base material of polysilicon apply voltages to respective pixel electrodes. In either type, a plurality of pixel electrodes arranged in a matrix and each controlled independently from another applies a voltage to one of a plurality areas of the LC layer.

Figure 15:
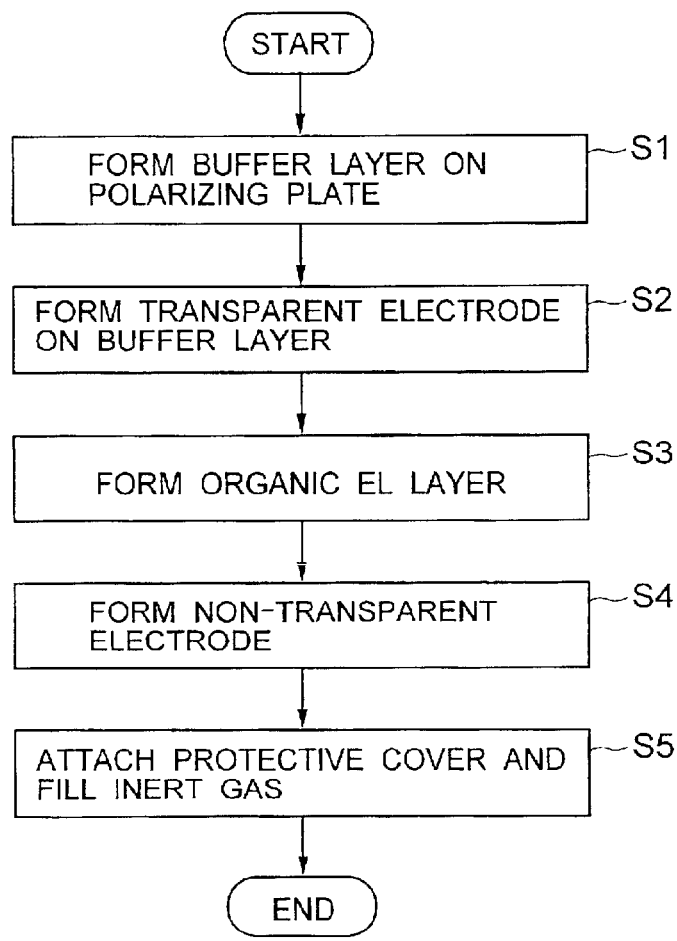
FIG. 15 is a flowchart of a process for manufacturing a LCD device of FIG. 13.

The LCD device of the present embodiment is fabricated by the process shown in FIG. 15. In general, the LCD unit 20 has a polarizing plate 29 made of a polymer at the front side thereof. In the fabrication process, a transparent buffer layer 41 is formed on the polarizing plate 29 of the LCD unit 20 in step S1. The transparent buffer layer 41 protects the polarizing plate 29 against damages caused by an organic solvent.

ITO (indium-tin-oxide) is then sputtered onto the entire surface of the transparent buffer layer 41 to form a transparent electrode 42 in step S2. In this step, care is taken for the heat generated during the sputtering step not to damage the constituent elements of the LCD device such as the polarizing plate 29. ITO is especially suited as the material for this purpose because the ITO film formed even at the room temperature has a uniform thickness and a relatively lower electric resistance. It is preferable that the transparent electrode 42 made of ITO film has a sheet resistance of 20 Ω/and a thickness of 100 nm.

Organic EL materials are then deposited on the transparent electrode 42 by using a vacuum evaporation technique to form an organic EL layer 43. The organic EL layer 43 may have any of known structures such as a two-layer structure including a luminescence layer and a hole injection/transport layer, or a three-layer structure including an electron injection/transport layer in addition to the two layers as recited above. A thin insulator film may be provided at the interface between the organic EL layer and the metallic electrode. Although the organic EL layer 43 is depicted as a single layer in FIG. 14, the organic EL layer may have one of such structures.

The organic EL layer 43 may be formed by a spin-coating technique, vacuum evaporation technique, or ink jet printing technique, and the organic EL materials, structure of the base and the process for forming the top electrode are selected depending on the technique used therein.

In the organic EL layer 43 of the present embodiment, the material for a hole injection/transport layer may be selected from the group including triarylamine derivative, an oxadiazole derivative, and a porphyrin derivative. The material for a luminescent layer may be selected from the group including a metal complex of either 8-hydroxyquinoline or a derivative thereof, a tetraphenylbutadiene derivative, and a distyrylaryl derivative. These layers may be formed by using a vacuum evaporation technique to form a multi-layered structure each layer of which is approximately 50 nm thick. The wavelength of light can be selected by appropriate selection of the organic EL material. In this embodiment, the material for the organic EL layer 43 is selected so that the light has three components having three peaks at approximately 450 nm, 540 nm and 630 nm in the wavelength corresponding to the three primary colors.

Subsequently, an alloy such as aluminum-lithium alloy is vacuum-evaporated by using a metallic shadow mask to form a non-transparent electrode 44 in step S4. The non-transparent electrode 44 has a thickness of 200 nm, for example.

A transparent protective cover 50 is then attached for protecting the front light unit 40 including the non-transparent electrode 44 etc. against oxygen or moisture and also protecting the LCD device against an external mechanical impact. The protective cover 50 has a thickness of about 1 mm and encloses the LCD device as a whole, and the air inside the protective cover 50 is replaced with an inert gas such as nitrogen or argon in step S5. The space within the protective cover 50 depends on the mechanical accuracy of the constituent elements of the LCD device, and may be around 0.3 mm for a LCD device having a diagonal size of 2 to 4 inches.

The process steps from the formation of the organic EL layer to the replacement by the inert gas is preferably conducted so that the constituent elements are not exposed to air. This is achieved by using a plurality of vacuum reactors suited for sputtering, evaporation etc.

In the LCD device thus fabricated, by applying a voltage between the electrodes 41 and 43, with the transparent electrode 41 being an anode and the non-transparent electrode 44 being a cathode, the area of the organic EL layer 43 sandwiched between the transparent electrode 41 and a stripe of the non-transparent electrode 44 functions as a diode emitting white light with three emission peaks.

The structure wherein the front light unit 40 is formed directly on the front surface of the LCD unit 20 affords an overall thickness smaller than the LCD device of FIG. 2 by the thickness of the transparent substrate. In addition, if the LCD device of the present embodiment is mounted on a cellular phone, the protective cover 50 may be implemented by a portion of the housing of the cellular phone. This reduces the number of steps for the assembly of the cellular phone.

The front light unit 40 has light emission areas and transparent areas alternately arranged and functions as an area-mission light source, as in the case of other embodiments. Thus, irrespective of whether or not the front light unit 40 is used as a light source for the LCD unit, the LCD device has an excellent display performance. More specifically, if the front light unit is used as a light source, the front light unit 40 illuminates uniformly over the entire display area of the LCD unit 20. Since there is no specific mechanism for changing the direction of external light in the front light unit 40, the LCD device of the present embodiment solves the problem of scattering of light or degradation of the display performance due to attachment of foreign matter, as encountered in the conventional LCD device. Furthermore, since almost all of the light emitted by the front light unit. 40 is used as illumination of the LCD unit 20 and reflected by the LCD unit 20 to reach the viewer, the optical efficiency of the front light unit 40 can be improved.

In operation of the LCD device of FIGS. 13 and 14, a voltage of 5 to 15 volts is applied between the transparent electrode 42 and the non-transparent electrode 44 of the front light unit 40, whereby white light is emitted from the emission area of the organic EL layer 43. If the front light unit 40 has no specific structure for light reflection or refraction, white light is emitted in all the directions. Thus, the light emitted toward the LCD unit 20 is irradiated as it is, whereas the light emitted toward the non-transparent electrode 44 is reflected thereby and also irradiated to the LCD unit 20. The light passes by the transparent substrate 27 and the color filters 26 of the LCD unit 20, and the light components having wavelengths selected by the color filters 26 reach the reflective members 22. The light components reflected by the reflective members 22 pass by the LCD unit 20 and the transparent area of the front light unit 40, thereby reaching the viewer. The light components have image information based on the control of voltages applied to the pixel elements of the LCD layer 24.

Figure 16:
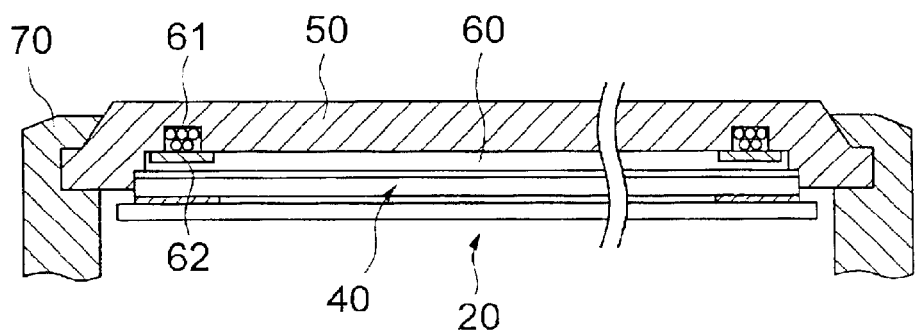
FIG. 16 is a sectional view of a LCD device according to a third embodiment of the present invention.

If there is a possibility that the protective cover 50 does not afford a sufficient protective function against oxygen or moisture, then, as shown in FIG. 16, a moisture absorbent 61 such as barium oxide may be used in the space 60 to which the front light unit 40 is exposed. In FIG. 16, the moisture absorbent 61 is received in a depression formed in the inner wall of the protective cover 50, and is fixed by a membrane 62. The moisture absorbent 61 is typically granular and has a grain size of about 0.2 mm. Thus, 0.3 mm is sufficient for the depth of the depression. This structure prevents an increase of the overall thickness of the LCD device.

Figure 17:
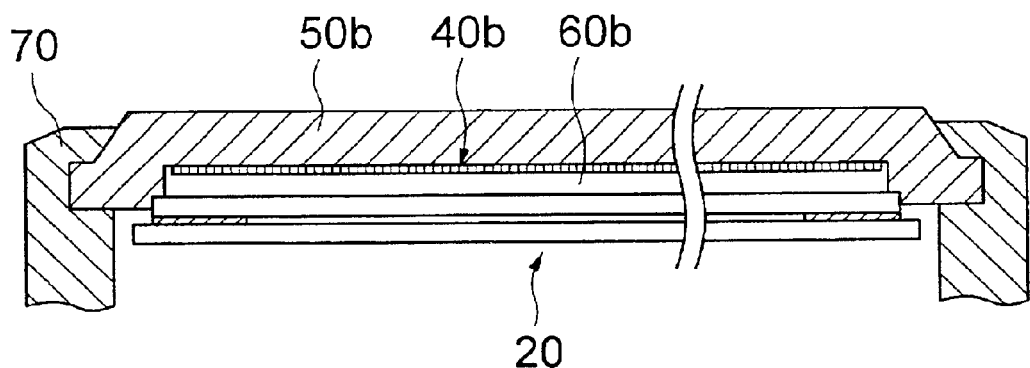
FIG. 17 is a sectional view of a LCD device according to a fourth embodiment of the present invention.
Figure 18:
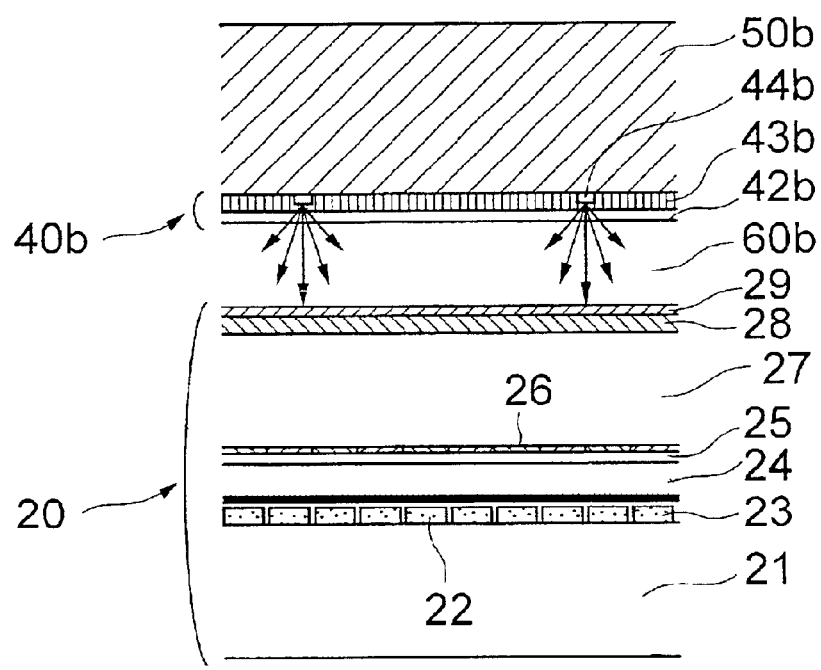
FIG. 18 is a detailed sectional view of the LCD device of FIG. 17.

Referring to FIGS. 17 and 18, a LCD device according to a fourth embodiment of the present invention has a structure wherein the front light unit 40b is formed on the inner wall of the transparent protective cover 50b. More specifically, the front light unit 40b includes a patterned non-transparent electrode 44b, an organic EL layer 43b and a transparent electrode 42b, which are consecutively formed on the inner wall of the protective cover 50b. The LCD unit 20 is fixed by an adhesive to the protective cover 50b on which the front light unit 40b is formed. The space 60b between the front light unit 40b and the LCD unit 20 is filled with an inert gas such as nitrogen.

Figure 20A:
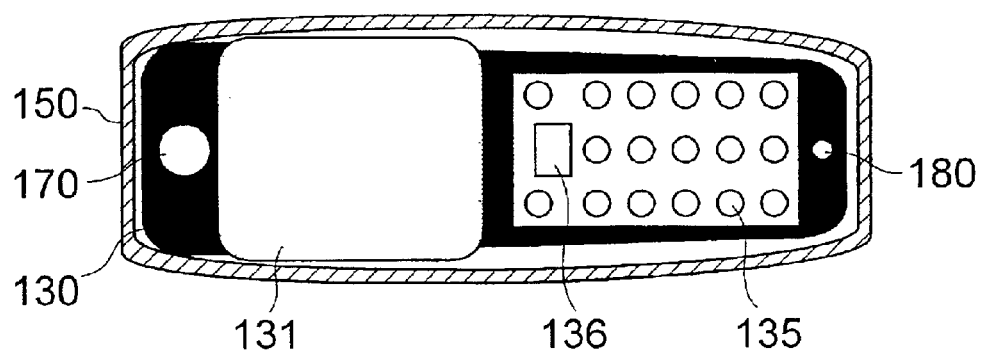
FIGS. 20A and 20B are top plan view and a sectional view, respectively, of a conventional cellular phone.
Figure 20B:
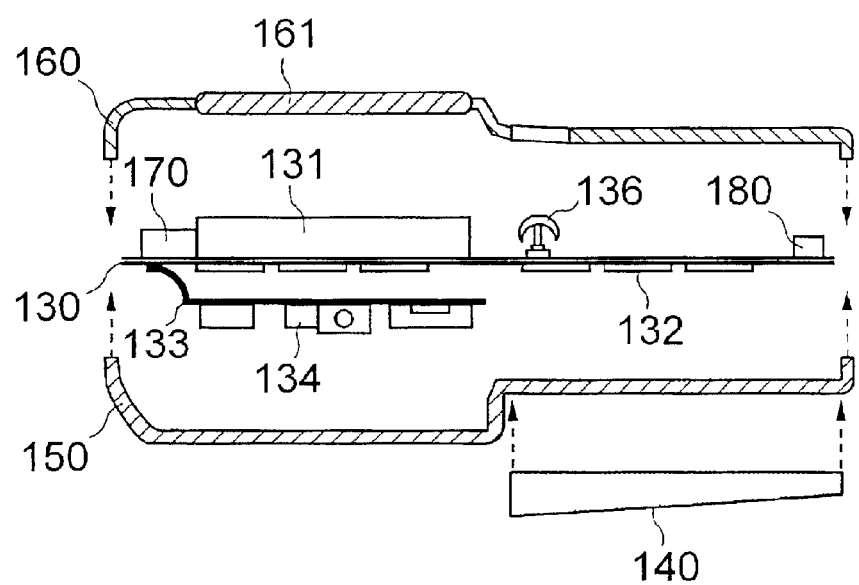

The operation of the LCD device of the present embodiment is similar to the operation of the LCD device of the third embodiment. The present embodiment achieves advantages similar to those of the third embodiment, In addition, due to the structure wherein the front light unit is formed directly on the protective cover, a moisture absorbent is unnecessary in the present embodiment, which enables further reduction of the overall thickness of the LCD device. The LCD device of the present invention is especially suited to the cellular phone such as shown in FIGS. 20A and 20B.

According to the above embodiments of the present invention, the LCD devices can be irradiated uniformly and efficiently, resulting in a superior display performance. Furthermore, even the adherence of foreign matter to the surface of the front light unit has little effect on the display performance. In addition, the number of components is smaller compared to the conventional front light unit having a light guide plate, enabling a reduction in manufacturing cost.

According to the second embodiment, in addition to the effects described above, the brightness of the front light unit can also be controlled by a simple drive circuit. According to the third embodiment, in addition to the effects observed for the first embodiment, a reflection type LCD device with a partial display function is also produced at low cost.

Figure 19A:
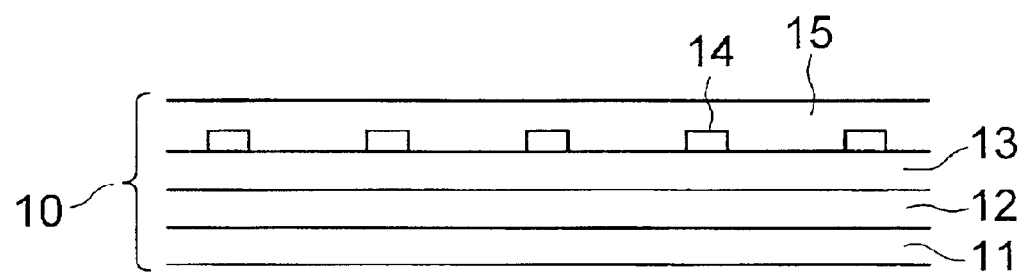
FIG. 19A is a sectional view of an organic EL device according to a fifth embodiment of the present invention.

Referring to FIG. 19A, an EL device according to a fifth embodiment of the present invention includes the structure similar to the structures of the front light unit in the LCD device of the first embodiment. More specifically, the EL device generally designated by numeral 10 includes a transparent substrate 11, and a multi-layered structure formed thereon. The multi-layered structure includes a transparent electrode 12, an organic EL layer 13, a patterned non-transparent electrode 14 and a protective layer 15, consecutively formed on the transparent substrate 11. The patterned non-transparent electrode 14 has a mesh structure.

In the EL device of the present embodiment, the front light unit includes a plurality of light emission areas each sandwiched between the transparent electrode 12 and one of the stripes of the mesh of the non-transparent electrode, and a plurality of transparent areas alternately and regularly arranged with the light emission areas. The EL device is used in association with a LCD unit as a front light unit therefor.

Figure 19B:
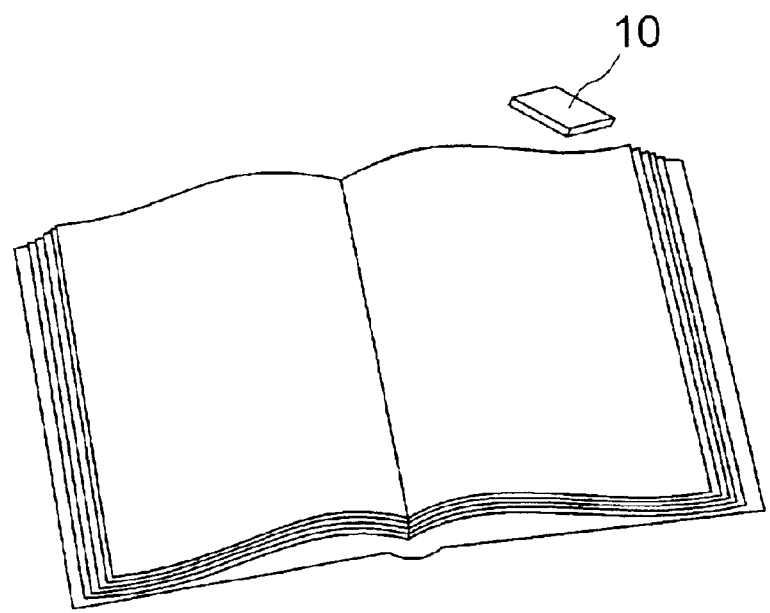
FIG. 19B is a perspective view showing the usage of the organic EL device of FIG. 19A.

Referring to FIG. 19B, the EL device 10 of the present embodiment may be used as a lighting unit for illumination of a book or a newspaper, with the transparent substrate being disposed on a metallic plate or a reflector. The EL device has smaller dimensions compared to the conventional light used for this purpose.

Since the above embodiments are described only for examples, the present invention is not limited to the above embodiments and various modifications or alterations can be easily made therefrom by those skilled in the art without departing from the scope of the present invention.

What is claimed is:

1. A liquid crystal display (LCD) device comprising a LCD unit and a front light unit disposed at a front side of said LCD unit, said LCD unit having a plurality of light reflective members arranged in a matrix, said front light unit including a light emission area for emitting light toward said LCD unit and a transparent area for passing light reflected from said light reflective members of said LCD unit toward a front side of said front light unit, wherein said front light unit includes a transparent substrate, and a transparent electrode, an organic electroluminescent layer, and a non-transparent electrode, which are consecutively formed on said transparent substrate, and wherein said LCD device is configured such that ambient light reflected by said plurality of light reflective members does not change course, and a resulting brightness of a display of said LCD device is substantially maximized.

2. The LCD device as defined in claim 1, wherein said light emission area has a property of reflecting light at a front side of said light emission area.

3. The LCD device as defined in claim 1, wherein said reflective members are arranged in a first pitch, said light emission area and said transparent area are arranged in a second pitch, and said second pitch is an integral multiple of said first pitch.

4. The LCD device as defined in claim 1, wherein said light emission area and said transparent area are arranged alternately in a first direction, said reflective members are arranged in a second direction, and said first direction and said second direction have a significant angle therebetween as viewed from the front.

5. The LCD device as defined in claim 1, wherein said light emission area includes a plurality of groups of emission sections, each group being controlled for light emission separately from one another.

6. The LCD device as defined in claim 1, wherein said non-transparent electrode is patterned to define said light emission area.

7. The LCD device as defined in claim 6, wherein said non-transparent electrode has a mesh structure.

8. A liquid crystal display (LCD) device comprising a LCD unit and a front light unit disposed at a front side of said LCD unit, said LCD unit having a plurality of light reflective members arranged in a matrix, said front light unit including a transparent electrode, an electroluminescent layer and a non-transparent electrode consecutively arranged as viewed toward a front side, wherein said LCD device is configured such that ambient light reflected by said plurality of light reflective members does not change course, and a resulting brightness of a display of said LCD device is substantially maximized.

9. The LCD device as defined in claim 8, further comprising a transparent protective member for covering the front side of said front light unit, wherein a space between said transparent protective member and said front light unit is filled with an inert gas.

10. The LCD device as defined in claim 9, wherein said LCD device is a display unit in a cellular phone.

11. The LCD device as defined in claim 8, further comprising a transparent protective member disposed in front of said front light unit, wherein said transparent protective member mounts thereon said transparent electrode, said light emission layer and said non-transparent electrode.

12. The LCD device as defined in claim 11, wherein a space between said LCD unit and said front light unit is filled with an inert gas.

13. The LCD device as defined in claim 11, wherein said LCD device is a display unit in a cellular phone.

14. A method for manufacturing a liquid crystal display (LCD) device comprising the steps of forming a LCD unit having a plurality of reflective members arrayed in a matrix, forming a transparent electrode in front of said LCD unit, forming an electroluminescent (EL) layer on said transparent electrode, and forming a non-transparent electrode disposed on said EL layer and having a specified pattern, and arranging said plurality of reflective members such that ambient light reflected by said light reflective members does not change course, and a resulting brightness of a display of said LCD device is substantially maximized.

15. The method as defined in claim 14, further comprising the steps of forming a transparent protective layer in front of said non-transparent electrode, and filling a space between said transparent protective member and said non-transparent electrode with an inert gas.

16. A method for manufacturing a liquid crystal display (LCD) device comprising the steps of forming a non-transparent electrode having a specific pattern on a transparent protective member, forming an electroluminescent (EL) layer on said non-transparent electrode, forming a transparent electrode on said EL layer, and forming a LCD unit at a rear side of this transparent electrode.

17. The method as defined in claim 16, further comprising the steps of filling a space between said transparent electrode and said LCD unit with an inert gas.

* * * * *